(12) United States Patent
Lai et al.

(10) Patent No.: US 10,337,115 B1
(45) Date of Patent: Jul. 2, 2019

(54) SURFACE TREATED COPPER FOIL FOR HIGH SPEED PRINTED CIRCUIT BOARD PRODUCTS INCLUDING THE COPPER FOIL AND METHODS OF MAKING

(71) Applicant: CHANG CHUN PETROCHEMICAL CO., LTD., Taipei (TW)

(72) Inventors: Yao-Sheng Lai, Taipei (TW); Kuei-Sen Cheng, Taipei (TW); Jui-Chang Chou, Taipei (TW)

(73) Assignee: CHANG CHUN PETROCHEMICAL CO., LTD., Taipei (TW)

( * ) Notice: Subject to any disclaimer, the term of this patent is extended or adjusted under 35 U.S.C. 154(b) by 0 days.

(21) Appl. No.: 15/863,256

(22) Filed: Jan. 5, 2018

(51) Int. Cl.
| | |
|---|---|
| *C25D 7/06* | (2006.01) |
| *B21C 37/00* | (2006.01) |
| *C25D 1/04* | (2006.01) |
| *B05D 1/02* | (2006.01) |
| *B32B 15/01* | (2006.01) |
| *B32B 15/08* | (2006.01) |
| *C25D 1/10* | (2006.01) |

(Continued)

(52) U.S. Cl.
CPC .............. *C25D 1/04* (2013.01); *B05D 1/02* (2013.01); *B32B 15/01* (2013.01); *B32B 15/08* (2013.01); *C25D 1/10* (2013.01); *H05K 1/0242* (2013.01); *H05K 1/09* (2013.01); *H05K 3/022* (2013.01); *H05K 3/188* (2013.01); *B32B 2457/08* (2013.01); *H05K 2203/0134* (2013.01); *H05K 2203/0307* (2013.01); *H05K 2203/0723* (2013.01)

(58) Field of Classification Search
None
See application file for complete search history.

(56) References Cited

U.S. PATENT DOCUMENTS

| | | | | |
|---|---|---|---|---|
| 5,552,234 A | * | 9/1996 | Kawasumi | ............... C25D 5/34 |
| | | | | 428/632 |
| 5,685,970 A | * | 11/1997 | Ameen | ............... C25D 7/0635 |
| | | | | 205/138 |

(Continued)

OTHER PUBLICATIONS

Dupont Kapton, 2017 (Year: 2017).*

*Primary Examiner* — David Sample
*Assistant Examiner* — Mary I Omori
(74) *Attorney, Agent, or Firm* — Nixon Peabody LLP; Thomas P. Pavelko

(57) ABSTRACT

Surface treated copper foils for use in high speed circuits on the order of 100 MHz or greater contain a reverse treated layer of copper nodules on the drum side of the electrolytically deposited copper foil to form a lamination side to be laminated to a dielectric material to form a copper clad laminate. Methods of forming the surface treated copper foil, and printed circuit boards (PCB) from the copper clad laminates are also described. The surface treated copper foils, copper clad laminates and PCBs can be incorporated into various electronic devices in which high speed signals are employed, including personal computers, mobile communications, including cellular telephones and wearables, self-driving vehicles, including cars and trucks, and aviation devices, including manned and unmanned vehicles, including airplanes, drones, missiles and space equipment including satellites, spacecraft, space stations and extra-terrestrial habitats and vehicles.

19 Claims, 8 Drawing Sheets

(51) Int. Cl.
*H05K 1/02* (2006.01)
*H05K 3/02* (2006.01)
*H05K 1/09* (2006.01)
*H05K 3/18* (2006.01)

(56) References Cited

U.S. PATENT DOCUMENTS

| | | | | |
|---|---|---|---|---|
| 5,779,870 | A * | 7/1998 | Seip | H05K 3/025 |
| | | | | 156/151 |
| 6,489,035 | B1 * | 12/2002 | Wang | C23C 2/02 |
| | | | | 205/125 |
| 9,647,272 | B1 * | 5/2017 | Cheng | H01M 4/667 |
| 2003/0111351 | A1 * | 6/2003 | Kim | C09D 4/00 |
| | | | | 205/111 |
| 2004/0161593 | A1 * | 8/2004 | Yamazaki | H05K 1/162 |
| | | | | 428/209 |
| 2013/0071755 | A1 * | 3/2013 | Oguro | C23C 30/00 |
| | | | | 429/245 |

* cited by examiner

Bare foil (drum side) ⇒ Treated foil

SURFACE TREATED COPPER FOIL FOR HIGH SPEED PRINTED CIRCUIT BOARD PRODUCTS INCLUDING THE COPPER FOIL AND METHODS OF MAKING

TECHNICAL FIELD

The present disclosure describes a copper foil that will readily transmit high-frequency electrical signals on the order of 100 MHz, or greater, which reduces the skin effect in which current flows only through the surface of a conductor. Printed circuit boards (PCB) incorporating the copper foil and electronic circuits and devices incorporating the copper foil are disclosed. Methods of manufacturing the copper foil and products incorporating the copper foil are also disclosed.

BACKGROUND

Higher frequency electrical signals are becoming a requirement of new electronic equipment, such as personal computers, mobile communications, including cellular telephones and wearables, self-driving vehicles, including cars and trucks, and aviation devices, including manned and unmanned vehicles, including airplanes, drones, missiles and space equipment including satellites, spacecraft, space stations and extra-terrestrial habitats and vehicles. When electrical signals on the order of 10 MHz are passed through conventional copper foils, the signal path is generally through the body of the copper foil as illustrated in FIG. 1. The current is able to tunnel below the surface profile and through the bulk of the conductor. However, when the frequency of the electrical signal is increased to 100 MHz or greater, the influence of the skin effect in which current flows only through the surface of the conductor becomes remarkable, as illustrated in FIG. 2. Here, the current is forced to follow every peak and trough of the surface profile increasing both path length and resistance.

In manufacturing electrolytically deposited copper foil, a drum rotates about a horizontal axis, with a lower portion of the drum immersed in a liquid electrolytic bath. The electrolytic bath comprises a solution including copper. When an electrical current is applied through the bath, utilizing an insoluble metal anode, with the drum acting as a cathode, the copper in solution plates upon the outer surface of the drum and can be separated from the drum in the form of a copper foil as shown in FIG. 3. The electrolytically deposited copper foil conventionally is described as having a "drum side" (i.e., that portion of the copper foil that was adjacent the drum during foil formation). This "drum side" has occasionally been referred to in the art as the "shiny side." The side of the electrolytically deposited copper foil opposite the drum side is called the "deposit side" (also sometimes called the "matte side" by persons in the art because, unlike the drum surface, which the drum side of the copper foil mirrors, the "deposit side" engages no solid surface during its formation but is subject to the liquid electrolytic bath during its formation. Therefore, the deposit side is generally more irregular in surface configuration than the drum side, as schematically illustrated in FIG. 4. This irregularity is termed "surface roughness" and can be measured. As used throughout this specification and claims, surface roughness is measured and provided as Rz standard, although there are other systems available to measure surface roughness. Not all measurement systems of surface roughness are equivalent. According to this standard, the results are presented as an average of 10 points.

A normally treated copper foil for incorporation into a copper clad laminate (a precursor to a PCB) has nodules added to the deposit side to aid in the adherence of the copper foil and polymeric component, which copper foil becomes laminated to the polymeric material of the copper clad laminate. The deposit side of the copper foil which engages the polymeric material is termed the "lamination side" as schematically illustrated in FIG. 5A. As schematically illustrated in FIG. 5A, the nodules will tend to deposit on the elevated portions ("peaks") of the surface irregularities of the deposit side of the copper foil. The opposing side of the copper foil (i.e., the drum side of the copper foil opposite the lamination side) is called the "resist side" because a resist, formed into a pattern, is placed upon the resist side of the copper foil to be etched by an acid or alkaline solution to remove portions of the exposed portions of the copper foil (i.e., the portions of the copper foil not covered by the resist) to form the printed circuit of the PCB. However, as can be readily seen in FIG. 5B, the electrical signal path is greatly attenuated when the skin effect of high-frequency signals on the order of 100 MHz or greater are attempted to be flowed through a copper foil which has been nodule treated on the deposit side of the copper foil, and any PCB incorporating the same, in the prior art due to the skin effect.

Thus, the prior art lacks an efficient way of transmitting high frequency signals on the order of 100 MHz or greater through a copper foil, PCBs and electronic products incorporating the same.

The embodiments described herein provide solutions to this long felt need of the prior art.

SUMMARY

The embodiments of the present invention describe a "reverse treated" copper foil ("RTF") in which nodules are deposited on the drum side of the copper foil. The nodule treated drum side of the copper foil then becomes the "lamination side" or the side which interfaces with the polymeric component of the copper clad laminate. The opposing deposit side of the copper foil then becomes the side onto which the resist is applied, and therefore is called the resist side as illustrated in FIG. 6.

After diligent study, the present inventors have found that a copper foil having a nodule treatment on the drum side which exhibits a surface roughness (Rz) on the nodule treated drum side in the range of 1.5 to 3.1 µm and a difference in light reflected at 570 nm and light reflected at 610 nm in the range of 15% to 30% can solve the problem of signal loss. In certain embodiments, the difference in light reflected at 570 nm and light reflected at 610 nm is in the range of 20% to 30%. In order to produce this particular type of copper foil, not only must the nodule treated drum side of the copper foil have a low surface roughness (Rz), but the distribution of nodules formed on the drum side of the copper foil according to the reverse treated copper foil must be random. Surface morphology of the surface of the drum used to produce the drum side of the copper foil is an important factor. Distribution of nodules must be random since non-random, or orientation of the nodules will lead to significantly increase of signal loss. Thus, non-random distribution of the nodules on the drum side of the copper foil linked to the morphology of the surface of the drum forming the drum side of the copper foil may contribute to, and result in, signal loss. The embodiments of this disclosure address both factors leading to signal loss.

Usually, the drum is made of pure titanium. However, during use in the acid containing bath, the surface of the drum accumulates impurities, such as by oxidizing into TiO, $TiO_2$ and combinations thereof, degrading the surface smoothness of the drum. In order to maintain the surface smoothness of the drum during a campaign of manufacturing indefinite lengths of copper foil, applicant has devised a method of removing the impurities in a systematic manner by the use of a buff applied intermittently to the surface of the drum in a controlled manner. The buff can be applied during the campaign of forming the copper foil, but the controlled manner of removing surface impurities utilizing the buff can also be achieved while the drum is off-line, such as when the factory is closed for routine maintenance or at other times when the drum is not manufacturing copper foil. Not only must the buff be applied in a controlled manner against the drum to effectively remove surface impurities, but the application of the buff must not produce gouges or other types of orientation of the impurities on the drum, or the drum surface itself, which can be imparted to the drum side of the copper foil and ultimately to the nodules formed on the drum side of the foil. The buff preferably forms an anisotropic or random surface on the drum when it is applied thereto in removing impurities from the drum surface.

Methods of manufacturing the copper foil disclosed herein, including other surface treatments of the copper foil are also disclosed as embodiments.

Methods of forming copper clad laminates, as well as PCBs incorporating the copper clad laminates and electronic products incorporating the same are also disclosed.

DETAILED DESCRIPTION OF THE PREFERRED EMBODIMENTS

Throughout the various drawing figures, like elements may employ the same numerals used in other figures. As used herein, the term "electrolytically deposited copper foil" means a bare copper foil as it is formed by separation of a copper foil formed by an electrolytic deposition from a copper-containing solution onto a drum under the effect of an electric current. The bare copper foil may then be subjected to various surface treatments as described below.

Figure 1:
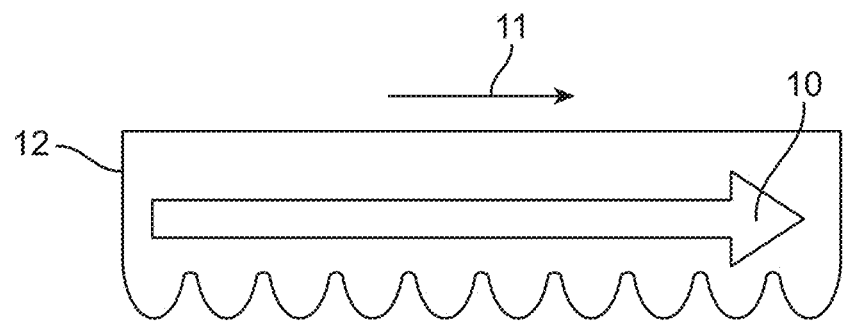
FIG. 1 schematically illustrates a signal path of a 10 MHz signal through a copper foil according to the prior art.
Figure 2:
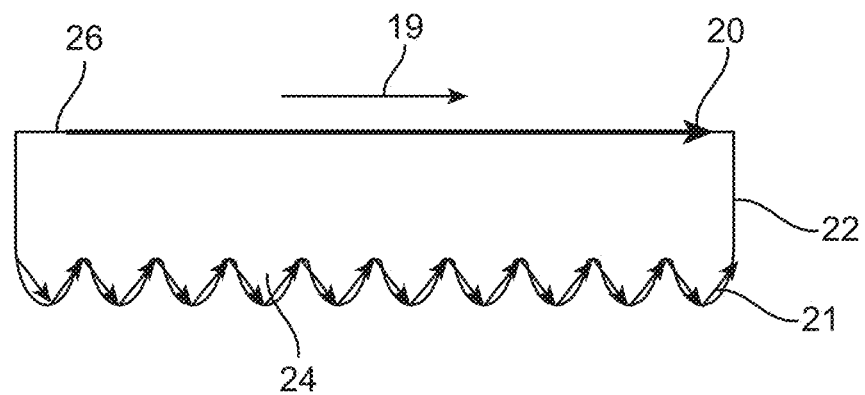
FIG. 2 schematically illustrates a signal path of a 100 MHz signal through a copper foil according to the prior art.

As shown in FIG. 1, where the arrow 11 illustrates the direction of a signal path through a copper foil 12, the current 10 is able to tunnel down into the body of copper foil 12 and generally flows through the body of the copper foil 12 as shown by arrow 10 when the frequency of the signal is on the order of 10 MHz. However, when the frequency of the signal reaches 100 MHz or higher in a copper foil 22 as shown in FIG. 2, the current no longer travels through the body of copper foil 22. As shown in FIG. 2, the arrow 19 illustrates the direction of a signal path. Here, the current tends to follow the skin of copper foil 22. The skin of copper foil 22 of FIG. 2 is depicted as being the surface of the drum side 26 and the surface of the deposit side 24. The current will therefore flow along the surface of the drum 26 as depicted by arrow 20 and also along the surface of the deposit side 24 as depicted by the arrow 21 as shown in FIG. 2. The relatively greater roughness of the deposit side 24, as compared to the surface roughness of the drum side 26, increases the distance that the current 21 must traverse, resulting in signal loss.

Figure 3:
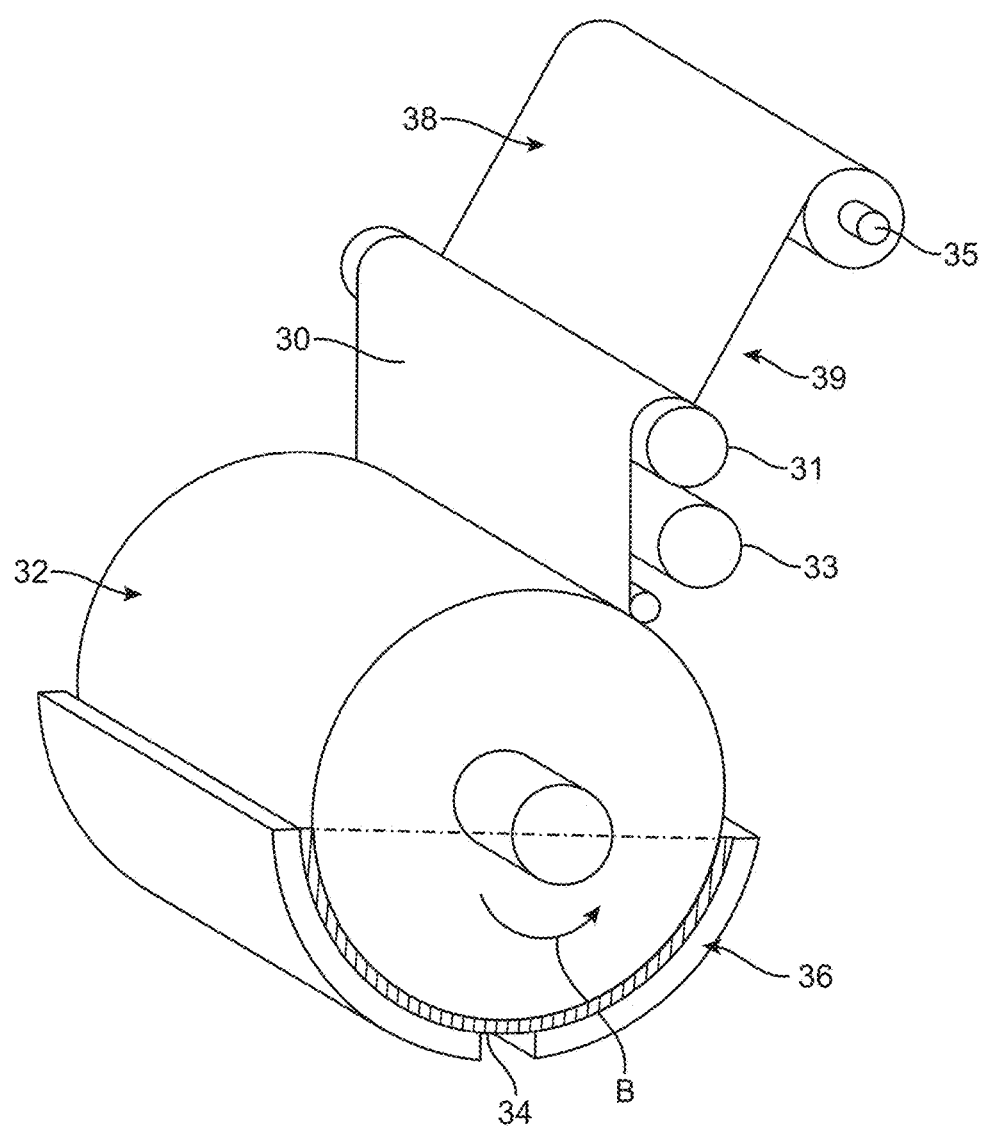
FIG. 3 schematically illustrates prior art apparatus for electrolytically forming copper foil.

FIG. 3 schematically illustrates a prior art apparatus for electrolytically forming a (bare or untreated) copper foil 30, where a rotating drum 32, (rotating in direction of arrow B), which acts as a cathode is partially immersed in a liquid electrolyte 34 containing copper in solution. An insoluble anode 36 can be used to apply a current through the electrolyte 34 to deposit a copper foil on the cathode drum 32. The copper foil 30 has two major surfaces, a "drum side" 38, which is the surface of the copper foil 30 formed against the drum 32, and a "deposit side" 39, which is the surface of the copper foil which is unsupported by a solid surface during formation by facing the liquid electrolyte 34 during its formation. Take up rollers 31, 33 can assist in removing copper foil 30 from drum 32 and conveying it to a spool 35.

Figure 4:
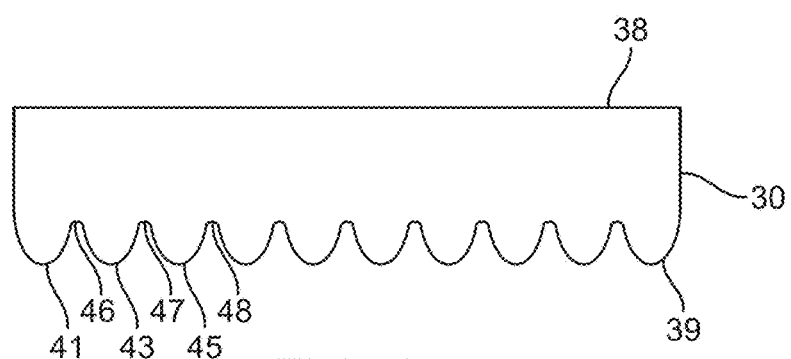
FIG. 4 schematically illustrates the relative roughness of the deposit side of a copper foil as compared to the drum side of the copper foil.
Figure 5A:
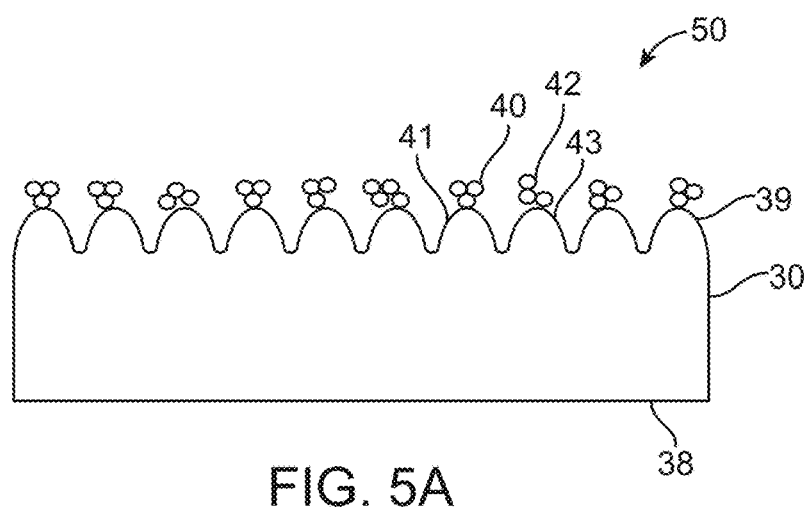
FIG. 5A schematically illustrates the lamination and resist sides of a copper foil made according to the prior art with nodules applied to the lamination side (deposit side) of the copper foil.
Figure 5B:
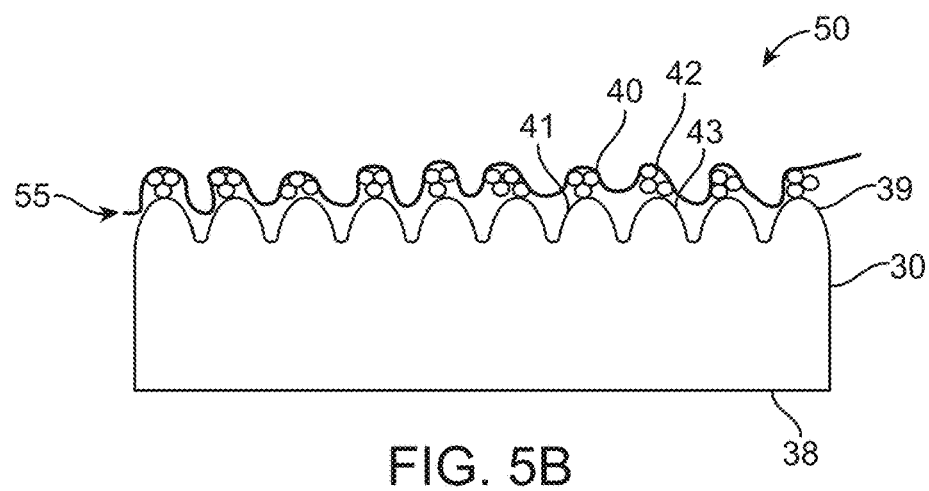
FIG. 5B schematically illustrates the signal path through the copper foil of FIG. 5A at a frequency on the order of 100 MHz.

As shown in the enlarged schematic representation in FIG. 4, the copper foil 30 having a drum side 38 has less surface roughness than deposit side 39, which comprises peaks 41, 43, 45, etc. and valleys 46, 47, 48, etc. In the prior art, schematically illustrated in FIG. 5A, nodules 40, 42, etc.

are deposited on the deposit side 39 in the normally treated copper foil as an aid to adhere the deposit side 39 (also termed the "lamination side" 50) of the copper foil 30 when this side is laminated to a polymeric component (not shown in FIG. 5A). However, due to the fact that the nodules are also deposited from a copper-containing solution (not shown in FIG. 5A) under the influence of an electrical current, the nodules, 40, 42, etc. tend to deposit on the high portions or "peaks" 41, 43, etc. on the deposit side 39 of copper foil 30. This further increases the skin effect on the conduction path 55, as shown in FIG. 5B, when high frequency signals on the order of 100 MHz or greater are passed through the foil, or any printed circuit board ("PCB") incorporating the same. The longer path results in signal loss. By the same plating process, the size of nodules would not differ very much. The diameter of nodules is less than 3 μm, less than 2 μm is preferable for lower signal loss. Typical materials which used as ultra-low signal loss substrates include, but are not limited to liquid-crystal polymers (LCP), polyphenylene oxides (PPO), polyphenylene ether (PPE), hydrocarbon materials, polytetrafluoroethylene (PTFE). For moderate signal loss substrates, suitable materials include, but are not limited to, epoxy resins or modified epoxy resins, for example bifunctional or polyfunctional Bisphenol A or Bisphenol F resins, epoxy-novolak resins, brominated epoxy resins, aramid-reinforced or glass fiber-reinforced or paper-reinforced epoxy resins (for example FR4), glass fiber-reinforced plastics, polyphenylene sulfides (PPS), polyoxymethylenes (POM), polyaryl ether ketones (PAEK), polyether ether ketones (PEEK), polyamides (PA), polycarbonates (PC), polybutylene terephthalates (PBT), polyethylene terephthalates (PET), polyimides (PI), polyimide resins, cyanate esters, bismaleimide-triazine resins, nylon, vinyl ester resins, polyesters, polyester resins, polyamides, polyanilines, phenol resins, polypyrroles, polyethylene naphthalate (PEN), polymethyl methacrylate, polyethylene dioxithiophene, phenolic resin-coated aramid paper, polytetrafluoroethylene (PTFE), melamine resins, silicone resins, fluorine resins, allylated polyphenylene ethers (APPE), polyether imides (PEI), polypropylenes (PP), polyethylenes (PE), polysulfones (PSU), polyether sulfones (PES), polyaryl amides (PAA), polyvinyl chlorides (PVC), polystyrenes (PS), acrylonitrile-butadiene-styrene (ABS), acrylonitrile-styrene acrylate (ASA), styrene acrylonitrile (SAN) and mixtures (blends) of two or more of the aforementioned polymers, which may be present in a wide variety of forms.

In order to improve adhesion between the lamination side of copper foil and substrate, suitable coupling agents may be provided. Such coupling agents can include silanes. These coupling agents can be applied directly to the lamination side of the copper foil. In some instances, a further layer can be provided on the lamination side of the copper foil and the coupling agent can be applied on this further layer. This further layer can be, but is not limited to a passivation layer. Suitable materials for forming a passivation layer include zinc, chromium, nickel and combinations thereof, including multi-layers of different metals. The coupling agents may include, but are not limited to, vinyltrimethoxysilane, vinyltriethoxysilane, 2-(3,4-epoxycyclohexyl)ethyltrimethoxysilane, 3-glycidoxypropyl methyldimethoxysilane, 3-glycidoxypropyl trimethoxysilane, 3-glycidoxypropyl methyldiethoxysilane, 3-glycidoxypropyl triethoxysilane, p-styryltrimethoxysilane, 3-methacryloxypropyl methyldimethoxysilane, 3-methacryloxypropyl trimethoxysilane, 3-methacryloxypropyl methyldiethoxysilane, 3-methacryloxypropyl triethoxysilane, 3-acryloxypropyl trimethoxysilane, N-2-(aminoethyl)-3-aminopropylmethyldimethoxysilane, N-2-(aminoethyl)-3-aminopropyltrimethoxysilane, 3-aminopropyltrimethoxysilane, 3-aminopropyltriethoxysilane, partially hydrolyzates of 3-triethoxysilyl-N-(1,3-dimethyl-butylidene)propylamine, N-phenyl-3-aminopropyltrimethoxysilane, N-(vinylbenzyl)-2-aminoethyl-3-aminopropyltrimethoxysilane hydrochloride, N-(vinylbenzyl)-2-aminoethyl-3-aminopropyltrimethoxysilane hydrochloride, tris-(trimethoxysilylpropyl)isocyanurate, 3-ureidopropyltrialkoxysilane, 3-mercaptopropylmethyldimethoxysilane, 3-mercaptopropyltrimethoxysilane, and 3-isocyanatepropyltriethoxysilane.

Figure 6:
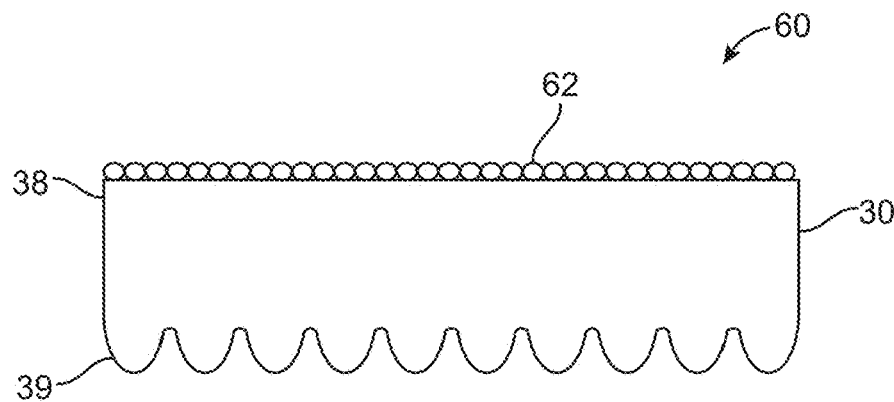
FIG. 6 schematically illustrates the reverse treated copper foil ("RTF") according to the present disclosure.

In the reverse treated copper foil ("RTF") according to the present embodiment schematically illustrated in FIG. 6, the copper foil 30, having a drum side 38 and a deposit side 39, has nodules randomly deposited on the drum side 38 to form a nodule layer 62. As drum side 38 is of a surface roughness (Rz) which is less than the surface roughness (Rz) of the deposit side 39, the nodules in nodule layer 62 do not exhibit the peak and valley configuration as shown in the prior art illustration of FIG. 5A. Nor do the nodules in nodule layer 62 tend to congregate at the peaks forming a non-uniform distribution of nodules on the lamination side. In FIG. 6, the "lamination side" 60 (the drum side of the copper foil containing the nodules which interface with the polymeric material of the PCB (not shown in FIG. 6)) has much less surface roughness (Rz) than the corresponding lamination side 50 of FIG. 5A. No matter how thick the copper foil is, the surface roughness of the drum side of the copper foil does not differ very much. Thus, copper foils having a thickness of about 9 μm to about 105 μm can be manufactured according to the present disclosure.

Figures 7B, 8B:
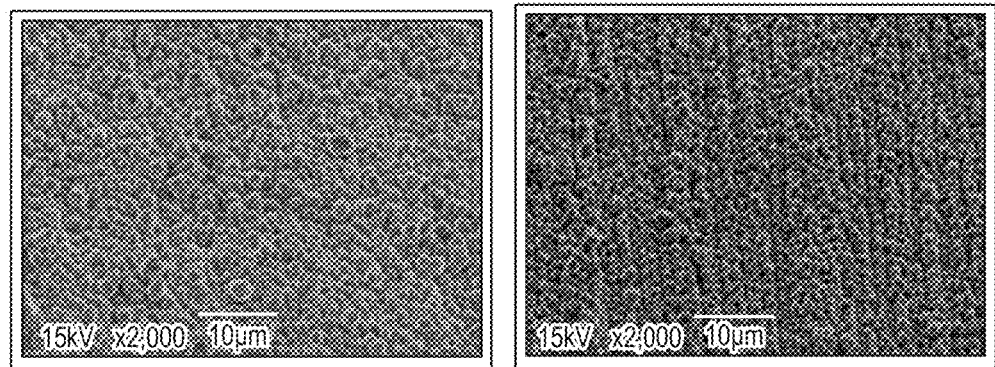
FIG. 7B is a photomicrograph of uniformly distributed copper nodules as schematically illustrated in FIG. 7A.
FIG. 8B is a photomicrograph of the non-uniformly distributed copper nodules as schematically illustrated in FIG. 8A.
Figure 7A:
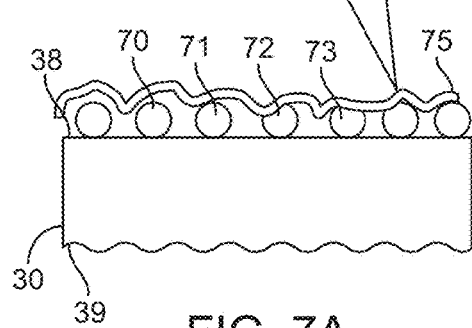
FIG. 7A is a schematic illustration of uniformly distributed nodules on a drum side of a copper foil.
Figure 8A:
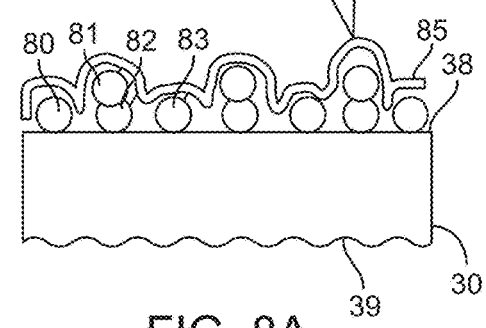
FIG. 8A is a schematic illustration of non-uniformly distributed nodules on a drum side of a copper foil.

Another factor affecting high-frequency signal loss at frequencies on the order of 100 MHz or higher is the uniformity of the distribution of nodules on the copper foil 30. As shown schematically in FIG. 7A, nodules 70, 71, 72, 73, etc. uniformly distributed on drum side 38 of copper foil 30 produce a shorter conduction path 75 than conduction path 85 when nodules 80, 81, 82, 83, etc. are non-uniformly distributed as schematically shown in FIG. 8A. The photomicrograph of FIG. 7B depicts the uniform distribution of nodules of FIG. 7A, while the photomicrograph of FIG. 8B depicts the anisotropic, non-directional and non-orientation of nodules (hereinafter "non-uniform distribution of nodules") of FIG. 8A. This is demonstrated as true even when the surface of the drum side 38 of the copper foil 30 used in FIGS. 7A and 7B is of the same surface roughness (Rz) as in FIGS. 8A and 8B.

The present applicant has also found that not only the uniformity, or lack thereof, of the distribution of the nodules on the surface of the drum side of a copper foil affects signal loss, but independently has found that randomness of distribution as compared to orientation of the nodules also affects signal loss of high-frequency signals on the order of 100 MHz or greater passing through a copper foil or a PCB incorporating the same.

Figure 9A:
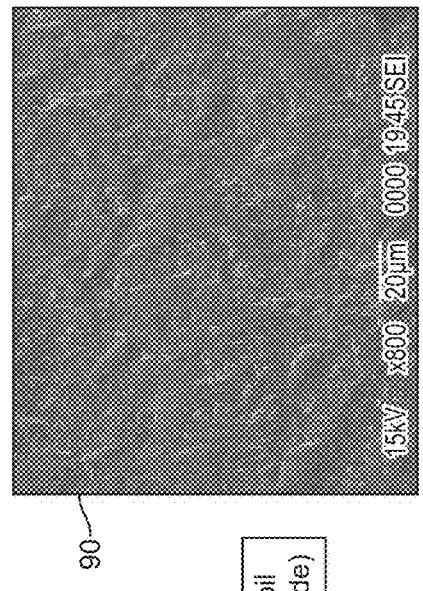
FIG. 9A is a photomicrograph of electrolytically deposited copper foil formed from a smooth surface of a drum.
Figure 9B:
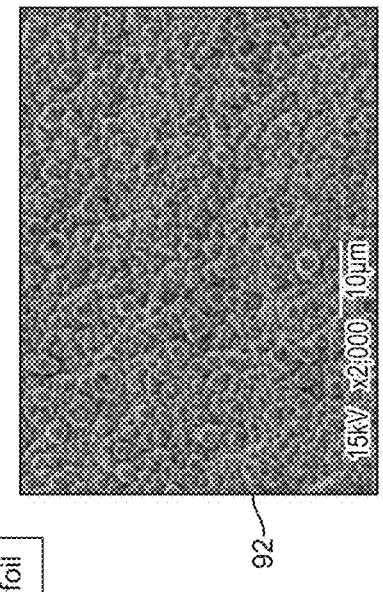
FIG. 9B is a photomicrograph of nodules formed on the electrolytically deposited copper foil of FIG. 9A.

As shown in the photomicrograph of FIG. 9A, the drum side 90 of a bare copper foil formed from a drum has an evenly conditioned smooth surface. The resulting random distribution of nodules 92 on the surface of the drum side of the bare copper foil of FIG. 9A is shown in the photomicrograph of FIG. 9B.

Figure 10A:
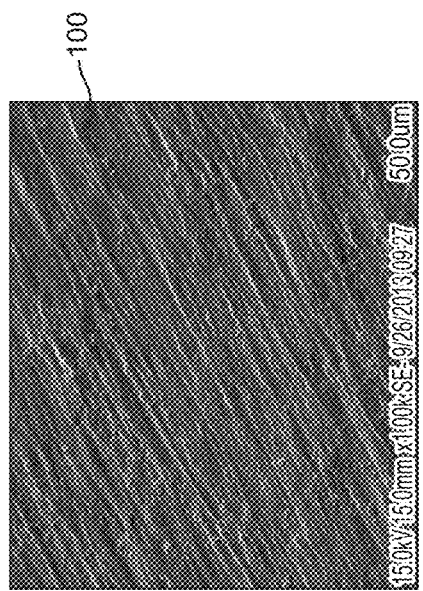
FIG. 10A is a photomicrograph of electrolytically deposited copper foil formed from an irregular surface of a drum.
Figure 10B:
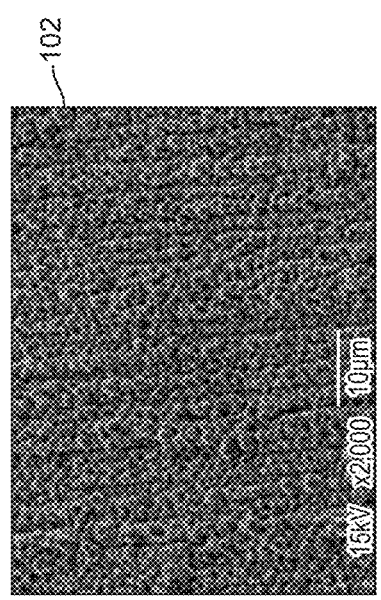
FIG. 10B is a photomicrograph of nodules formed on the electrolytically deposited copper foil of FIG. 10A.

By comparison, FIG. 10A is a photomicrograph of the drum side 100 of a bare copper foil formed from a drum that was overly conditioned leaving clear gouges and peaks on the surface of the drum side of the bare copper foil. When the drum side of the bare copper foil of FIG. 10A was subsequently treated to form nodules 102 thereon, the clear orientation of the nodules is evident in the photomicrograph of FIG. 10B. A visual comparison of the photomicrograph of FIG. 9B clearly depicts the randomness of distribution of the nodules 92 as compared to the oriented distribution of nodules 102 in FIG. 10B. The orientation of the nodules 102 deleteriously affects the length of the signal path resulting in a greater signal loss in the copper foil of FIG. 10 B as compared to the lower signal loss in FIG. 9B.

Figure 11:
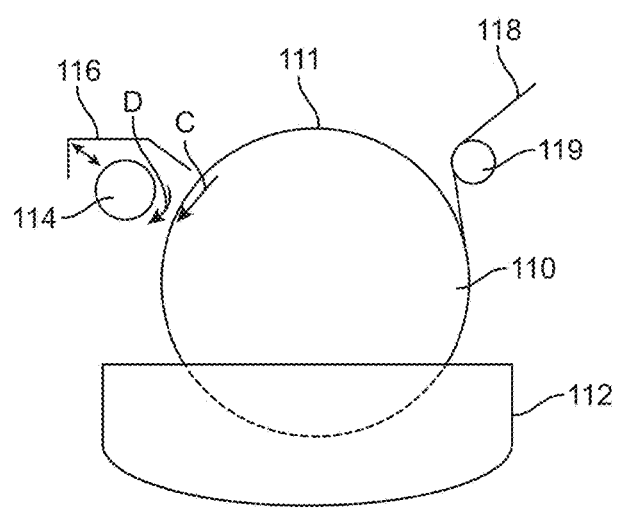
FIG. 11 is a schematic representation of the use of a buff on the cathode drum during a campaign of forming copper foil.

In order to maintain the rotating cathode drum 110 in a continuous condition during the period of time an indefinite length of copper foil is being produced, applicant has devised the apparatus and method schematically illustrated in FIG. 11. A rotating cathode drum 110, typically made of pure titanium is partially immersed in a liquid electrolyte 112 containing copper in solution. A buff 114, partially surrounded by enclosure 116 is position so as to periodically be moved into a position so as to engage the outer surface 111 of cathode drum 110. Under the effect of an electrical current (not shown in FIG. 11) passing through the liquid electrolyte 112, copper is deposited on the outer surface 111 of cathode drum 110, which is separated from cathode drum 110 as bare copper foil 118 with the aid of a roller 119. Buff 114 rotates in the direction depicted by arrow D and the direction of rotation of cathode drum 110 is depicted by arrow C. Even though the cathode drum 110 is made of pure titanium, during a campaign of making copper foil, the outer surface 111 of cathode drum 110 becomes fouled by impurities caused by the effects of the electrolytic process of forming the bare copper foil 118. Such impurities can include oxides of titanium such as TiO, $TiO_2$ and mixtures thereof, as well as contaminants from the electrolyte bath. Periodically during the campaign of producing the bare copper foil 118, the buff 114 is brought into contact with the outer surface 111 to remove these impurities and contaminants in a controlled manner. The intermittent times may vary depending on the speed of rotation of the cathode drum 110, which also depends on the thickness of the bare copper foil 118 being produced. Applicant has normally found that bringing the buff 114 into contact with the outer surface 111 may be effected when 8,000~10,000 meters of copper foil have been produced. Other times may be set depending not on the length of copper foil being produced, but upon the number of rotations of the cathode drum 110, or upon the residence time of outer surface 111 of the cathode drum 110 in the liquid electrolyte 112. Merely bringing the buff 114 into contact with outer surface 111 may not produce a good polish of outer surface 111. Thus, several interrelated parameters have an effect on the result of the contact between the buff 114 and outer surface 111. Firstly, the buff 114 must not gouge, or mar the outer surface 111 during the polishing. Gouged or marred outer surface 111 leads to high surface roughness (Rz) in the copper foil electro-deposited thereon. Secondly, the outer surface 114 must not develop a morphology or orientation during polish by the buff 114. Orientation of the outer surface 111 during polishing leads to a corresponding morphology and orientation in the copper foil electro-deposited on outer surface 111. Thirdly, too light a polish may not remove the surface impurities from outer surface 111 making the polishing ineffective. It is the result of the interaction of these varying parameters that lead to an effective polishing campaign.

The value $D_{max}$, which is the extent of polish that the buff provides to contaminated outer surface 111 of cathode drum 110 which must satisfy the following relationship:

$$D_{max} = \frac{\text{Drum Speed}}{\text{Buff Speed}} \times (\text{Load Current})^{1/2}$$

To make the polish efficient, the buff contacts the outer surface 111 of cathode drum 110 under a certain pressure which is a function of load current. However, merely looking at one of the parameters makes it impossible to identify good polish. All three parameters need to be considered as a whole and therefore a good polish can be achieved by controlling $D_{max}$ in the range of 0.0061 to 0.0175. Even if surface morphology is not disrupted, the drum is still not workable if a low $D_{max}$ means less polish and the impurities cannot be completely removed, i.e., the impurities still remain on the outer surface 111 of the cathode drum 110, resulting in pure conductivity and affecting the roughness and morphology of the copper foil.

Figure 12:
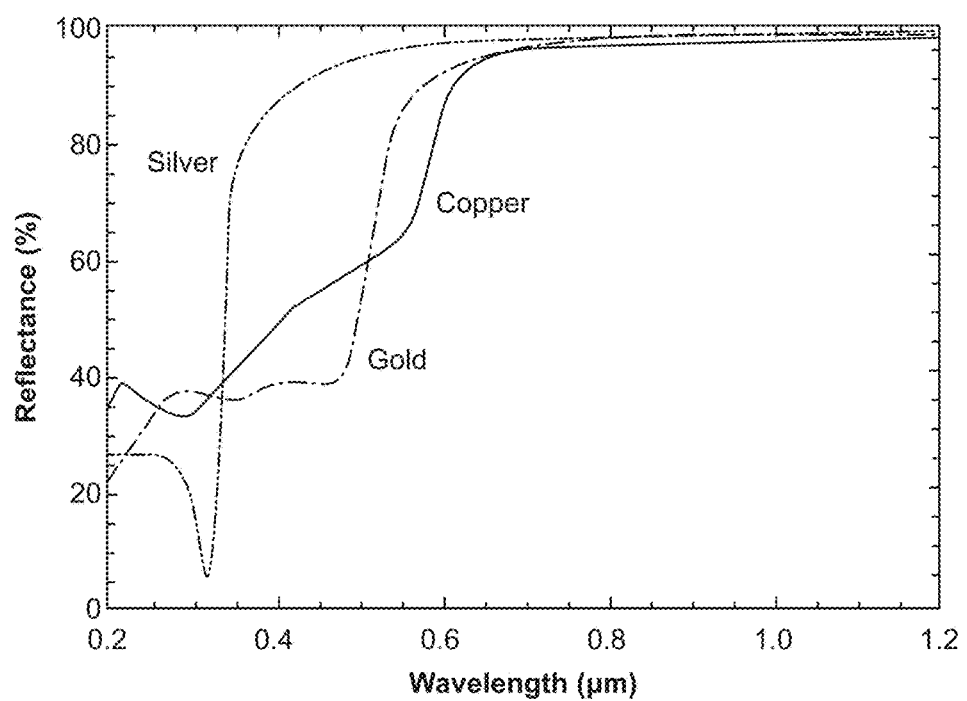
FIG. 12 is a graphic representation of reflected wavelengths for the metals, silver, gold and copper.

A determination of the polish characteristics cannot be made by the unaided human eye because the polish lines are small and oriented by the direction of polish. Thus, a linear light inspection system must be utilized to determine the polish characteristics. Light can be reflected from metals such as silver, gold and copper as shown in FIG. 12. The wavelengths of the light reflected between low reflectance and high reflectance seem to give the metal its characteristic colors. For copper, these wavelengths transit from 570 nm to 610 nm. These wavelengths can be measured by various spectrophotometers.

Figure 13A:
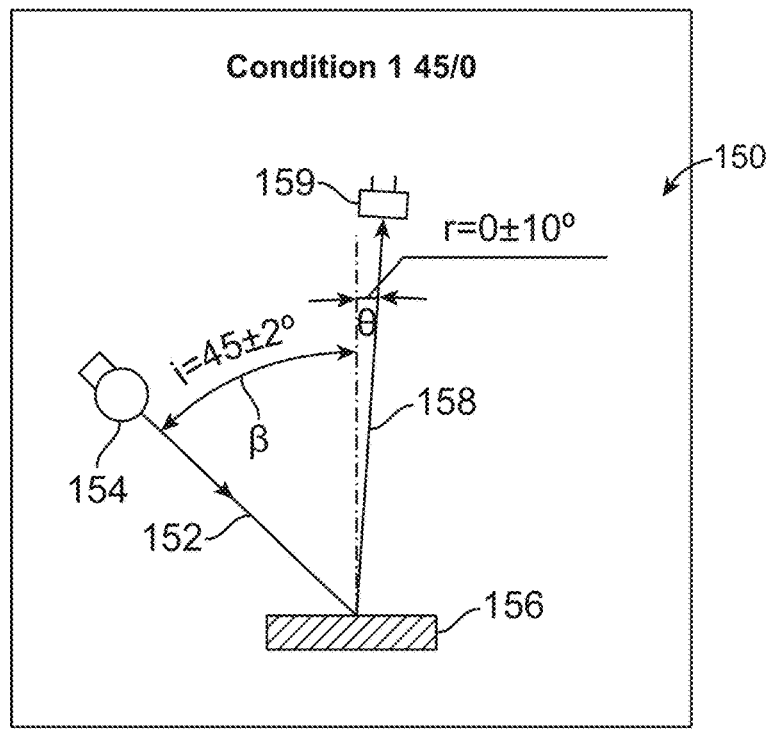
FIG. 13A is a schematic representation of a Unidirectional Illumination System used to distinguish polish characteristics.

Two types of light inspection systems are available to determine the polish characteristics. The first system, depicted in FIG. 13A, is a Unidirectional Illumination System 150. As shown in FIG. 13A, illumination light 152, from an illumination light source 154 is impinged upon specimen 156, at an angle β measured from an axis normal to specimen 156. The angle β is 45°±2° and the reflected light 158 is received by a light receptor 159 positioned in the normal direction (0°) or offset by an angle θ. Angle θ is 0±10°. The Unidirectional Illumination system therefore provides illumination from one direction only.

Figure 13B:
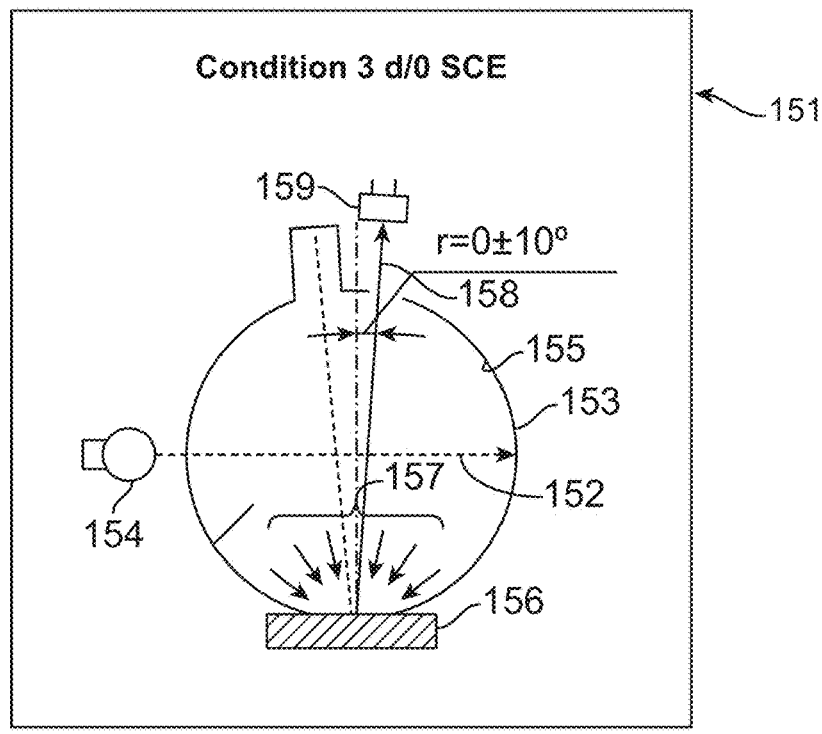
FIG. 13B is a Diffused Illumination Integrating Sphere System used to distinguish polish characteristics; and, FIG. 14 is a schematic representation of a method for making a surface treated copper foil in one embodiment with the placement of electrodes to primarily treat the drum side of the copper foil.

The second system is depicted in FIG. 13B and is a Diffused Illumination Integrating Sphere System 151. This system 151 uses an integrating sphere 153 for illuminating or viewing a specimen 156 uniformly from all directions. The integrating sphere 153 is a spherical device with its internal surfaces coated with a white material, such as barium sulfate, so that light is uniformly diffused. An illumination light source 154 emits an illumination light 152 which impinges on the internal surface 155 of integrating sphere 153. Diffused light 157 impinges on specimen 156 and is reflected and captured by light receptor 159. The light receptor 159 can capture the reflected light 158 in a normal direction (0±10°) from the specimen 156. Reflected light within ±5° from the specular angle can be included or excluded using the SCE/SCI function of the system. However, the captured light is mixed light and cannot distinguish the features of surface morphology. Linear light source is used to identify the orientation of the surface of the copper foil, i.e. distinguish that the orientation of the nodules as linear or non-linear. Thus, this is the reason that the Unidirectional Illumination System 150 is employed by the present inventors to distinguish surface morphology, rather than the Diffusion Illumination Integrating Sphere System 151.

Different materials reflect light differently and therefore give an object an appearance of a different color. For example, the metals silver, gold and copper appear to each be different colors. This appearance of different colors results from the reflectance of light, See FIG. 12. Silver almost reflects all visible light, so all the wavelengths of visible light mix together. On the other hand, gold reflects from green to yellow region in the visible spectrum. Copper reflects the yellow to red region of the visible spectrum. While it is obvious that every metal reflects light differently, copper reflects light in the visible light range from about 570 nm to 610 nm. Applicant has found that differences in reflected light at the wavelengths of 570 nm and 610 nm give an indication of surface morphology of the specimen.

Applicant has used this phenomenon to distinguish between good and bad surfaces of polish on a drum by applying different light wavelengths to a drum side of a copper foil that has been treated to contain nodules. By gauging the difference of reflectance from a nodule treated surface on a drum side of copper foil at two different wavelengths (570 nm and 610 nm) on the same sample, the level of polish line of the surface of the drum can be ascertained.

Example 1

Drum Polishing by Buff
  Drum Speed: 1.0~5.0 m/min.
  Buff Speed: 150~550 rpm, (#1500, Nippon Tokushu Kento Co., Ltd.)
  Load Current: 0.5~1.5 A
Manufacturing of Electrolytically Deposited Copper Foil (Bare Copper Foil)

Copper wires were dissolved in a 50 wt. % sulfuric acid aqueous solution to prepare a copper sulfate electrolyte containing 320 g/L of copper sulfate ($CuSO_4.5H_2O$) and 100 g/L of sulfuric acid. To per liter of the copper sulfate electrolyte, 20 mg chloride ion, 0.35 mg gelatin (DV, Nippi Company) was added. Subsequently, an electrolytically deposited copper foil (bare or untreated copper foil) with a thickness of 18 μm was prepared at the liquid temperature of 50° C. and a current density of 70 A/dm².

A typical device for manufacturing an electrolytically deposited copper foil comprises a metal cathode drum and an insoluble metal anode, the metal cathode drum being rotatable about a central longitudinal axis and having a mirror polished surface, generally as shown in FIG. 3. The insoluble metal anode is arranged at approximately the lower half of the metal cathode drum and surrounds the metal cathode drum. A copper foil is continuously manufactured with the device by flowing a copper electrolytic solution between the cathode drum and the anode, applying an electric current between these to allow copper to be electrodeposited on the cathode drum until a predetermined thickness is obtained.

The electrolytically deposited copper foil so produced has a drum side (the surface of the copper foil formed on the cathode drum) and a deposit side (the surface of the copper foil in contact with the liquid copper electrolytic solution) which is on the surface of the copper foil opposite the drum side.

Surface Treatment
  Acid Washing Treatment:

At the beginning, the electrolytically deposited copper foil, (also called the bare copper foil due to not being treated yet) was directed into an acid washing treatment. In the acid washing treatment, the inside of an acid washing vessel was filled with an electrolyte solution, which had 130 g/L copper sulfate and 50 g/L sulfuric acid, and the temperature of electrolyte solution was maintained at 27° C. The bare copper foil was soaked into the electrolyte solution for 30 seconds to remove oil, fat and oxide on the surface of the bare copper foil and then the bare copper foil was washed with water.

Roughing Treatment

The copper nodule layer was formed by electroplating on the surface of the drum side of the copper foil. For the formation of the copper nodule layer, a copper sulfate solution was used in which the concentration of copper sulfate and sulfuric acid were 70 g/L and 100 g/L, respectively, and the solution temperature was 25° C., and electrolysis was conducted for 10 seconds at current density of 10 A/dm². After roughing treatment, the nodule treated copper foil contains a nodule treated drum side and an opposite side defined as a resist side.

Covering Treatment

Furthermore, a copper plating layer was formed by conducting a covering treatment for preventing the exfoliation of the copper nodule layer. In the covering treatment, a copper sulfate solution was used in which the concentrations of copper sulfate and sulfuric acid were 320 g/L and 100 g/L, respectively, and the temperature of the electrolyte solution was maintained at 40° C. and the current density was 15 A/dm².

Zinc Passivation Treatment

Then, at completion of the covering treatment, formation of a first passivation layer was conducted. In this passivation treatment, zinc was used as the passivating element, and not only the surface of the copper nodule layer, but also the resist side of the electrodeposited copper foil, were simultaneously passivated to form a first passivation layer on each side. A zinc sulfate solution was used as the electrolyte in which the zinc sulfate concentration was maintained at 100 g/L, the pH of solution was 3.4, the solution temperature was set at 50° C., and the current density was set at 4 A/dm².

Nickel Passivation Treatment

At the completion of the zinc passivation treatment, washing with water was conducted. A second passivation treatment using an element other than the element used in the first passivation treatment is selected to form a second passivation layer. For the purpose of acid-proofing, an electrolytic nickel passivation was made over the zinc passivation only on the nodule treated drum side. Electrolytically, a nickel passivation layer (also called the nickel layer) was formed on the zinc passivation layer (also called the zinc layer). The electrolysis condition was as follows: Nickel sulfate ($NiSO_4.7H_2O$): 180 g/L, Boric Acid ($H_3BO_3$): 30 g/L, sodium hypophosphite ($NaH_2PO_2$): 3.6 g/L, temperature: 20° C., current density: 0.2 A/dm², Time: 3 seconds, pH: 3.5. Thus, the surface treated copper foil would have a first passivation layer of zinc formed on both the lamination and resist sides of the copper foil, while the surface treated copper foil would have a second passivation layer of nickel only on the lamination side of the copper foil to form a nodule treated passivated side of the copper foil.

Chromate Passivation Treatment

On completion of the second passivation treatment, washing with water was conducted.

Furthermore, for the purpose of rustproofing, an electrolytic chromate passivation was made over the zinc and nickel passivation layers. Electrolytically, a chromate layer was formed on the nickel and zinc passivation layers. The electrolysis condition was as follows: chromic acid: 5 g/L, pH: 11.5, solution temperature: 35° C., and current density: 10 A/dm². This electrolytic chromate passivation was made not only on the nickel passivated surface of copper nodule layer but also simultaneously on the resist (deposit/matte) side of the copper foil, which comprises the first passivation element or zinc layer. After nickel passivation treatment, there comes chromate passivation on both sides of copper foil.

Silane Coupling Treatment

On completion of the chromate passivation treatment, washing with water, and immediately, without drying the copper foil surface, the adsorption of a silane coupling agent was made only on the Zn/Ni/Cr passivation layer of the copper nodule layer to form the nodule treated passivated side of the copper foil in a silane coupling treatment vessel in order to aid coupling of the passivated nodule treated drum side of the copper foil (now called the lamination side) to a substrate of polymeric dielectric material. In this treatment, the concentration of solution was 0.25 wt. % 3-glycidoxypropyl trimethoxysilane. The adsorption treatment was performed by spraying the solution against the nodule treated copper foil surface only.

Measurements

Surface Roughness

Surface roughness is measured and provided as Rz standard, utilizing JIS B 0601-1994, using an α-type surface roughness and contour measuring instrument (manufactured by Kosaka Laboratory Ltd., Model SE1700).

Gloss

Gloss was measured using a gloss meter (manufactured by BYK Company, Model No. micro-gloss 60° type) according to JIS Z8741, i.e., by measuring the gloss at the nodule treated drum side in the transverse direction (TD) at a light incidence of 60°.

Reflectance

Reflectance was measured using a portable spectrophotometer (manufactured by Konica Minolta, Model No. CM-2500c), i.e., by measuring the reflectance of the nodule treated drum side at a wavelength of 570 nm and a wavelength of 610 nm separately.

Signal Loss (Transmission Loss)

The surface treated copper foil is laminated on the dielectric substrate (IT-150GS manufactured by ITEQ corporation having Dk<3.9 and Df<0.012 at 10 GHz tested under the conditions specified by IPC-TM-650 No. 2.5.5.13) and a microstrip structure is formed. Signal loss was measured by an Agilent PNA N5230C Network Analyzer at a frequency of 10 GHz, sweep number: 6401 point, calibration: TRL, IF: 30 kHz, temperature: 25° C. under Test Method: Cisco S3 method. The microstrip structure has a thickness of 210 μm, conductor length of 102 mm, conductor thickness of 18 μm, conductor circuit width of 200 μm, characteristic impedance of 50Ω, and no coverlay film. Among the measurement values, the transmission losses (dB/m) corresponding to the frequencies at 10 GHz was described when the transmission loss value of a light polish foil (the lowest $D_{max}$ value, listed in Comparative Example 1) was assumed to be 100.

The results of the polish conditions of a drum and the resulting properties of surface treated copper foil for Examples 1-13 and Comparative Examples 1-14 are set forth in the following Tables 1 and 2.

TABLE 1

| | Polish condition of the drum | | | | Properties of the surface treated copper foil | | | | | Performance |
|---|---|---|---|---|---|---|---|---|---|---|
| | Drum speed (m/min) | Buff speed (rpm) | Load current (A) | $D_{max}$ | Rz of nodule treated drum side (□m) | Gloss (60°) | Reflectance at 570 nm (%) | Reflectance at 610 nm (%) | Difference of reflectance (%) | Signal loss at 10 GHz (%) |
| Example 1 | 3.0 | 350.0 | 0.5 | 0.0061 | 3.1 | 0.5 | 29.3 | 44.5 | 15.2 | 41.1 |
| Example 2 | 5.0 | 550.0 | 0.5 | 0.0064 | 2.8 | 1.2 | 28.5 | 45.0 | 16.5 | 39.2 |
| Example 3 | 1.0 | 150.0 | 1.0 | 0.0067 | 2.7 | 1.8 | 27.7 | 44.8 | 17.1 | 37.4 |
| Example 4 | 3.0 | 550.0 | 1.5 | 0.0067 | 2.7 | 1.9 | 27.8 | 45.1 | 17.3 | 37.2 |
| Example 5 | 1.0 | 150.0 | 1.5 | 0.0082 | 2.5 | 2.5 | 26.9 | 46.2 | 19.3 | 33.9 |
| Example 6 | 3.0 | 350.0 | 1.0 | 0.0086 | 2.5 | 2.7 | 25.8 | 45.8 | 20.0 | 32.7 |
| Example 7 | 5.0 | 550.0 | 1.0 | 0.0091 | 2.3 | 3.0 | 25.0 | 46.9 | 21.9 | 28.5 |
| Example 8 | 5.0 | 350.0 | 0.5 | 0.0101 | 2.1 | 3.5 | 24.3 | 47.6 | 23.3 | 27.3 |
| Example 9 | 3.0 | 350.0 | 1.5 | 0.0105 | 2.1 | 3.7 | 24.1 | 47.9 | 23.8 | 27.1 |
| Example 10 | 5.0 | 550.0 | 1.5 | 0.0111 | 1.9 | 4.1 | 23.2 | 47.9 | 24.7 | 26.5 |
| Example 11 | 3.0 | 150.0 | 0.5 | 0.0141 | 1.7 | 4.5 | 21.6 | 49.4 | 27.8 | 23.0 |
| Example 12 | 5.0 | 350.0 | 1.0 | 0.0143 | 1.7 | 4.6 | 21.4 | 49.4 | 28.0 | 22.7 |
| Example 13 | 5.0 | 350.0 | 1.5 | 0.0175 | 1.5 | 5.1 | 20.5 | 50.2 | 29.7 | 21.6 |

TABLE 2

| | Polish condition of the drum | | | | Properties of the surface treated copper foil | | | | | Performance |
|---|---|---|---|---|---|---|---|---|---|---|
| | Drum speed (m/min) | Buff speed (rpm) | Load current (A) | $D_{max}$ | Rz of nodule treated drum side (□m) | Gloss (60°) | Reflectance at 570 nm (%) | Reflectance at 610 nm (%) | Difference of reflectance (%) | Signal loss at 10 GHz (%) |
| Comp. Example 1 | 1.0 | 550.0 | 0.5 | 0.0013 | 4.4 | 0.1 | 36.1 | 42.6 | 6.5 | 100.0 |
| Comp. Example 2 | 1.0 | 550.0 | 1.0 | 0.0018 | 4.1 | 0.1 | 34.3 | 42.4 | 8.1 | 81.2 |
| Comp. Example 3 | 1.0 | 350.0 | 0.5 | 0.0020 | 4.0 | 0.2 | 33.6 | 43.2 | 9.6 | 66.7 |
| Comp. Example 4 | 1.0 | 550.0 | 1.5 | 0.0022 | 3.9 | 0.2 | 33.2 | 42.9 | 9.7 | 66.5 |

TABLE 2-continued

| | Polish condition of the drum | | | | Properties of the surface treated copper foil | | | | | Performance Signal |
| --- | --- | --- | --- | --- | --- | --- | --- | --- | --- | --- |
| | Drum speed (m/min) | Buff speed (rpm) | Load current (A) | $D_{max}$ | Rz of nodule treated drum side (μm) | Gloss (60°) | Reflectance at 570 nm (%) | Reflectance at 610 nm (%) | Difference of reflectance (%) | loss at 10 GHz (%) |
| Comp. Example 5 | 1.0 | 350.0 | 1.0 | 0.0029 | 3.8 | 0.2 | 32.0 | 42.3 | 10.3 | 63.4 |
| Comp. Example 6 | 1.0 | 350.0 | 1.5 | 0.0035 | 3.7 | 0.3 | 31.5 | 43.5 | 12.0 | 54.8 |
| Comp. Example 7 | 3.0 | 550.0 | 0.5 | 0.0039 | 3.7 | 0.3 | 31.4 | 44.0 | 12.6 | 52.6 |
| Comp. Example 8 | 1.0 | 150.0 | 0.5 | 0.0047 | 3.6 | 0.4 | 30.9 | 44.3 | 13.4 | 48.4 |
| Comp. Example 9 | 3.0 | 550.0 | 1.0 | 0.0055 | 3.4 | 0.4 | 30.1 | 44.4 | 14.3 | 46.5 |
| Comp. Example 10 | 3.0 | 150.0 | 1.0 | 0.0200 | 1.4 | 0.3 | 30.7 | 61.2 | 30.5 | 59.3 |
| Comp. Example 11 | 5.0 | 150.0 | 0.5 | 0.0236 | 1.4 | 0.3 | 31.3 | 62.4 | 31.1 | 65.5 |
| Comp. Example 12 | 3.0 | 150.0 | 1.5 | 0.0245 | 1.4 | 0.3 | 31.9 | 63.8 | 31.9 | 70.2 |
| Comp. Example 13 | 5.0 | 150.0 | 1.0 | 0.0333 | 1.5 | 0.2 | 32.8 | 65.5 | 32.7 | 78.1 |
| Comp. Example 14 | 5.0 | 150.0 | 1.5 | 0.0408 | 1.5 | 0.2 | 34.0 | 68.1 | 34.1 | 85.4 |
| Comp. Example 15 | 5.0 | 100.0 | 2.0 | 0.0707 | 1.9 | 0.1 | 28.4 | 70.5 | 42.1 | 93.3 |

Gloss is another value of interest in evaluating the surface of the nodule treated drum side of a copper foil. Although the dispersion caused by many nodules results in a gloss that is not high, if the surface of the bare copper foil is from a well-polished drum, the gloss is still relatively higher than the gloss from a poorly polished drum as reported in Table 1 above.

Figure 14:
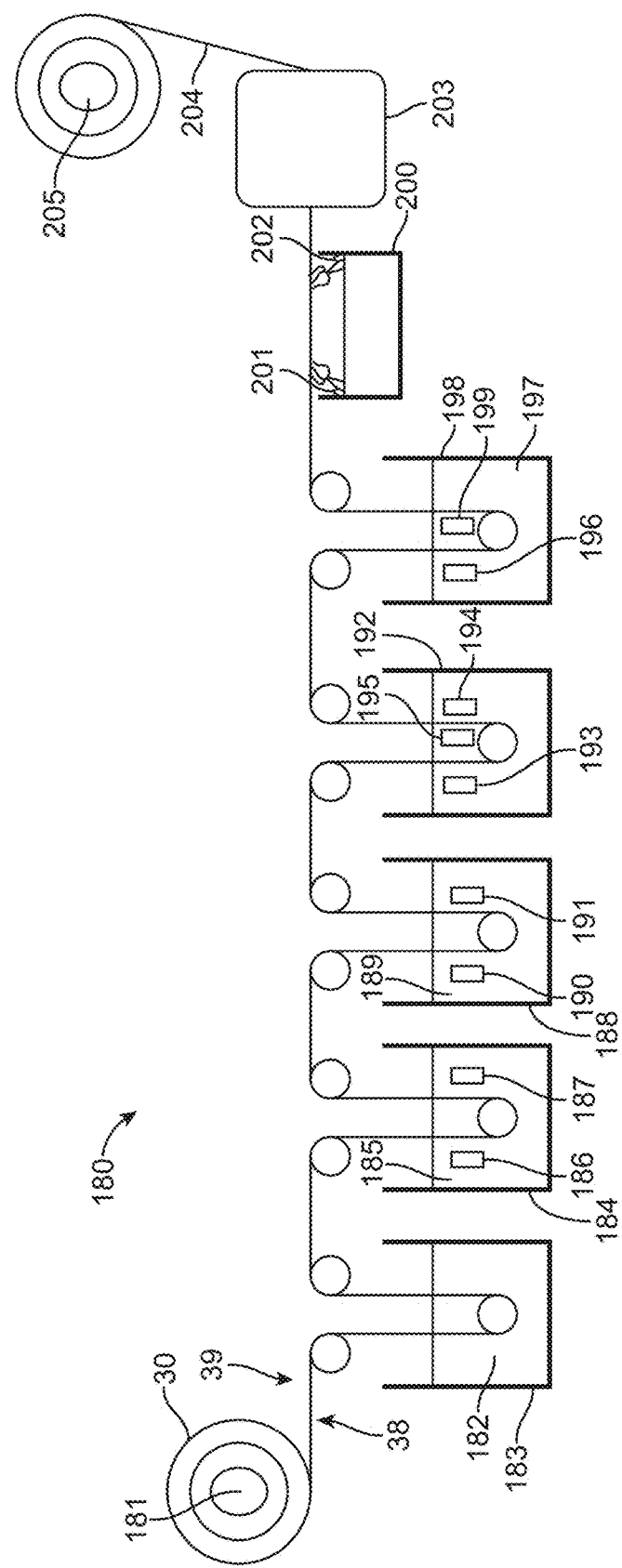

The manufacturing process for making copper foils suitable for incorporation into copper clad laminates, PCBs, and electronic devices containing the same will be described in connection with FIG. 14. As shown in FIG. 14, a bare copper foil 30, taken from spool 181, having a deposit side 39 and a drum side 38 is passed through a cleaning solution 182 in cleaning vessel 183, which cleans both the drum side 38 and deposit side 39 of any oil, fat and oxide on the surfaces of copper foil 30. Next, the cleaned foil is fed into roughing vessel 184, containing an electrolyte 185 which is a copper sulfate solution in sulfuric acid. Two anodes 186, 187 act only upon the drum side 38 of copper foil 30, with copper foil 30 acting as the cathode upon which copper nodules (not shown in FIG. 14) are formed. A covering vessel 188, containing another copper sulfate solution 189, again under the influence of an electric current generated between anodes 190, 191, with the copper foil again acting as the cathode, plates a covering layer of copper only on the nodules on the drum side 38 of the nodule treated copper foil. The covering layer prevents exfoliation of the copper nodules. Next, the copper foil 30 is passed through an alloying vessel 192, containing a zinc sulfate solution to passivate the copper foil. In vessel 192 are placed two anodes 193, 194 to passivate the nodule treated drum side of copper foil 30 under the effect of an electric current, with the copper foil 30 acting as a cathode. Simultaneously anode 195 passivates the deposit side 39 of copper foil 30. An anti-tarnish coating of chromium is formed on the passivated nodule treated drum side 38 of copper foil 30 by passing a current between anode 196, with the copper foil 30 acting as the cathode through a chromic acid solution 197 contained in the chromium anti-tarnish vessel 198. Simultaneously anode 199 acting through the effect of an electric current passed through anode 199 with copper foil 30 acting as the cathode creates a chromium coating layer over the zinc passivation layer on deposit side 39. Lastly the nodule treated drum side 38 is passed over a silane treatment vessel 200 where sprays of silane 201, 202 impact only the nodule treated drum side 38 of copper foil 30. After passing through oven 203, the surface treated copper foil 204 is wound upon spool 205.

The surface treated copper foil can be utilized in many types of printed circuit boards, but is especially useful when high-frequency signal (100 MHz or greater) is passed through the copper foil or circuits made therefrom.

In order to take advantage of the features of the surface treated copper foil, it must be adhered, typically by lamination through the nip of pressure rolls to a substrate, typically a dielectric material to form a copper clad laminate. However, signal loss in a PCB can roughly be divided into two parts. One is conduction loss, which means the loss by the copper foil. The other is dielectric loss, which means loss by the substrate. It is desired that both Dk (dielectric constant) and Df (loss tangent) be as low as possible to reduce signal loss. Thus, polymeric materials having Df<0.001 and Dk<3.9 are preferred. Lamination between the surface treated copper foil with the substrate always occurs on the lamination side of the copper foil, in this case the drum side having a layer of nodules on the drum side of the copper foil. The opposing side of the copper foil is called the resist side. A resist (which can be classed as positive working or negative working), which can be formed into a pattern in situ on the resist side (deposit side) of the surface treated copper foil can be various materials. Many such resists are known in the art, and the use of a specific resist with the surface treated copper foils of the invention is not outside the scope of the invention. Suitable resists include linear polymers containing a few percent of a light sensitive molecule (an activator or sensitizer). The activator absorbs incident radiation and promotes cross-linking of the polymer, thereby increasing its molecular weight leading to insolubility of that portion of the resist. A developer, which is a solvent for the unexposed portions is applied and washes away unexposed areas. A positive working resist is a polymer containing up to 25% of an inhibitor that prevents wetting and attack by a developer. Upon optical exposure, the inhibitor is destroyed and exposed areas become soluble in the developer, an alkaline, aqueous-based solvent for the polymer. Poly(vinyl cinnamate) (a negative working resist) or positive working resists such as those which rely on decomposition reactions of quinonediazides or tetraarylborates are mentioned. Many others are known in the art. Suitably, a mask (suitably generated by computer controlled light spot or electron beam) is placed over the photoresist and the mask and exposed photoresist are exposed to light to form a pattern in the resist and the mask is removed. Portions of the resist so removed (negative- or positive-working) expose the resist side of the copper foil. An etching agent, typically an acid-based solution is then applied to etch (remove) the copper foil in a predetermined manner to form the circuit. Various dielectric materials can yield ultra-low loss values (Df on the order of 0.005) but the cost of such materials increases compared with mid-loss dielectrics having 0.010<Df<0.015.

The printed circuit boards thus produced can then be assembled with other components, such as leads, holes and other components to form various electrical devices utilizing high speed signals of at least 100 MHz. Such devices may include personal computers, mobile communications, including cellular telephones and wearables, self-driving vehicles, including cars and trucks, and aviation devices, including manned and unmanned vehicles, including airplanes, drones, missiles and space equipment including satellites, spacecraft, space stations and extra-terrestrial habitats and vehicles.

While we have described certain preferred embodiments in connection with this specification, drawings and Examples, our disclosure is not intended to be limited by that description which is merely exemplary. Nor is any order of components or steps to be inferred by the manner in which the preferred embodiments were disclosed, nor in the order listed in the appended claims. It is readily apparent to those skilled in the art reading this disclosure that various alternative materials, steps and products could be substituted for those expressly disclosed without departing from the spirit and scope of the appended claims.

We claim:

1. A surface treated copper foil for use in a high speed printed circuit board comprising:
    an electrolytically deposited copper foil having a drum side and a deposit side, and
    a layer of nodules deposited directly on, and only on, the drum side of the electrolytically deposited copper foil to form a nodule treated drum side of the surface treated copper foil;
    wherein the nodule treated drum side of the surface treated copper foil exhibits a surface roughness (Rz) in the range of 1.5 to 3.1 µm; and,
    wherein the nodule treated drum side of the surface treated copper foil exhibits a difference of reflectance between 570 nm and 610 nm in the range of 15% to 30%.

2. The surface treated copper foil of claim 1, wherein the nodule treated drum side exhibits a reflectance at 570 nm in the range of 20% to 30%.

3. The surface treated copper foil of claim 1, wherein the nodule treated drum side exhibits a reflectance at 610 nm in the range of 44% to 51%.

4. The surface treated copper foil of claim 1, wherein the nodule treated drum side exhibits a gloss at 60° in the range of 0.5 to 5.1.

5. The surface treated copper foil of claim 1, further comprising a copper plating layer over the layer of nodules.

6. The surface treated copper foil of claim 5, further comprising a zinc layer over each of the copper plating layer and the deposit side of the electrolytically deposited copper foil.

7. The surface treated copper foil of claim 6, further comprising a nickel layer on the zinc layer over the copper plating layer.

8. The surface treated copper foil of claim 1, further comprising a silane coupling treated layer formed by treating the surface treated copper foil with a silane coupling agent.

9. The surface treated copper foil of claim 8, wherein the silane coupling agent comprises a 3-glycidoxypropyl triethoxysilane.

10. The surface treated copper foil of claim 8, wherein the silane coupling agent comprises a 3-aminopropyltriethoxysilane.

11. A copper clad laminate comprising the surface treated copper foil of claim 1 and a dielectric resin, the dielectric resin exhibiting a Dk<3.9 and a Df<0.012 under test conducted according to IPC-TM 650 No. 2.5.5.13.

12. A printed circuit board comprising the copper clad laminate of claim 11.

13. An electronic component comprising the printed circuit board of claim 12.

14. An electronic device comprising the electronic component of claim 13.

15. The electronic device of claim 14, wherein the electronic device processes high frequency signals of at least 100 MHz.

16. The electronic component of claim 13, wherein the electronic component processes high frequency signals of at least 100 MHz.

17. The surface treated copper foil of claim 1, wherein the nodules in the nodule layer have a diameter of less than 3 µm.

18. The surface treated copper foil of claim 17, wherein the nodules have a diameter of less than 2 µm.

19. A surface treated copper foil for use in a high speed printed circuit board for processing high frequency signal of at least 100 MHz comprising:
    an electrolytically deposited copper foil having a drum side and a deposit side, and
    an electroplated layer of copper nodules deposited directly on, and only on, the drum side of the electrolytically deposited copper foil to form a nodule treated drum side of the surface treated copper foil;
    wherein the nodule treated drum side of the surface treated copper foil exhibits a surface roughness (Rz) in the range of 1.5 to 3.1 µm; and,
    wherein the nodule treated drum side of the surface treated copper foil exhibits a difference of reflectance between 570 nm and 610 nm in the range of 15% to 30%.

* * * * *